United States Patent
Kapp

[11] Patent Number: 5,860,121
[45] Date of Patent: Jan. 12, 1999

[54] METHOD AND APPARATUS FOR PROGRAMMING ELECTRICALLY REPROGRAMMABLE NON-VOLATILE MEMORY AND A UNIT INCLUDING SUCH APPARATUS

[75] Inventor: Thierry Kapp, Illkirch, France

[73] Assignee: Alcatel N.V., Amsterdam, Netherlands

[21] Appl. No.: 234,866

[22] Filed: Apr. 28, 1994

[30] Foreign Application Priority Data

Apr. 29, 1993 [FR] France .................................. 93 05089

[51] Int. Cl.⁶ ..................................... G06F 12/16
[52] U.S. Cl. ...................... 711/162; 711/103; 707/204; 391/182.04
[58] Field of Search .................. 395/442, 311, 395/309, 430, 182.04, 892; 235/380, 492; 711/103, 165, 162; 707/204

[56] References Cited

U.S. PATENT DOCUMENTS

| | | | |
|---|---|---|---|
| 4,748,320 | 5/1988 | Yorimoto et al. | 235/492 |
| 5,038,025 | 8/1991 | Kodera | 235/492 |
| 5,200,600 | 4/1993 | Shinagawa | 235/492 |
| 5,386,541 | 1/1995 | Moridaira | 395/431 |
| 5,634,079 | 5/1997 | Buxton | 395/892 |

FOREIGN PATENT DOCUMENTS

| | | |
|---|---|---|
| 0335812A2 | 10/1989 | European Pat. Off. |
| 0489204A1 | 6/1992 | European Pat. Off. |

OTHER PUBLICATIONS

Japanese Patent Abstract JP5813795 dated Aug. 15, 1983.

*Primary Examiner*—Eddie P. Chan
*Assistant Examiner*—Hiep T. Nguyen
*Attorney, Agent, or Firm*—Sughrue, Mion, Zinn, Macpeak & Seas, PLLC

[57] ABSTRACT

A method and apparatus for programming electrically reprogrammable non-volatile memory associated with a processor which is also conventionally associated with read/write memory, both of which memories are necessary to operate the processor in a determined manner, optionally within some larger unit. In order to load the permanent data required for operation of the processor into the non-volatile memory, a memory-activation signal provided by the processor is switched to a temporarily connected auxiliary memory in order to start up the processor on the basis of initiation data contained in the auxiliary memory, to transfer into the read/write memory data that is present in the auxiliary memory and that corresponds to the data for recording in the non-volatile memory, and then to transfer the data from the read/write memory into the non-volatile memory after the processor has deactivated the auxiliary memory.

6 Claims, 1 Drawing Sheet

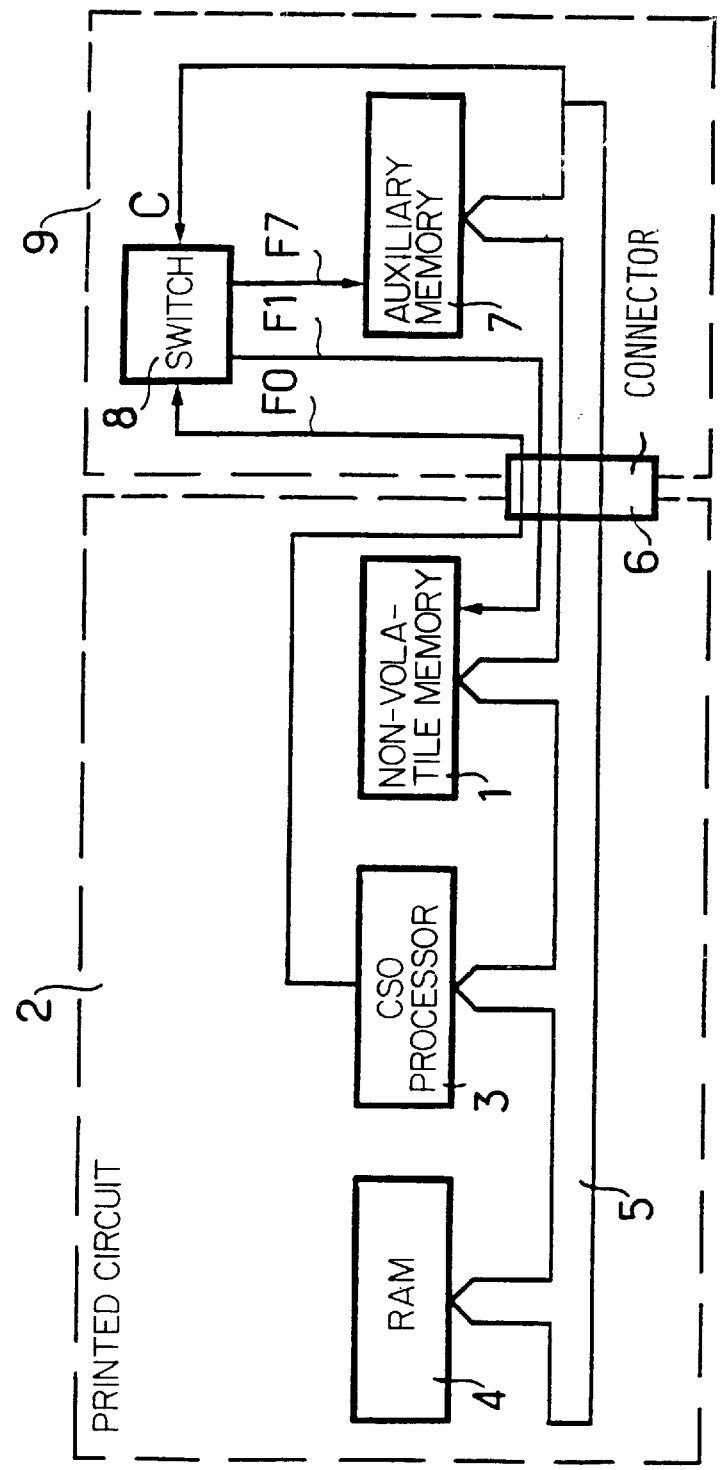

METHOD AND APPARATUS FOR PROGRAMMING ELECTRICALLY REPROGRAMMABLE NON-VOLATILE MEMORY AND A UNIT INCLUDING SUCH APPARATUS

The invention relates to a method and to apparatus for programming electrically reprogrammable non-volatile memory(ies), and to a unit including such apparatus.

BACKGROUND OF THE INVENTION

In conventional manner, electrically programmable non-volatile memories, in particular those known as the FLASH EPROM type, are suitable for being programmed prior to being installed on and soldered to the printed circuit cards that they are designed to equip. However, that requires said memories to be handled prior to being soldered to the cards in which they are going to be used, and it is desirable to eliminate such additional handling.

Commercially-available appliances also exist that enable electrically reprogrammable non-volatile memories to be programmed when they are installed on the printed circuit cards to which they have just been fitted. However those appliances which make connections with the cards for gaining access to the memories that are to be programmed are relatively expensive.

OBJECTS AND SUMMARY OF THE INVENTION

The invention thus provides a method of programming an electrically reprogrammable non-volatile memory associated with a processor which is also conventionally associated with a read/write memory, both of which memories being necessary to operate the processor in a determined manner.

According to a characteristic of the invention, in order to load the blank or empty non-volatile memory with the permanent data necessary for enabling the processor to operate in the determined manner, a non-volatile memory activation signal is switched to an auxiliary memory that is temporarily connected to a communications bus between the memories and the processor, which activation signal is provided by the processor, thereby enabling said processor to be started up from initiation data contained in the auxiliary memory, thereby enabling the data that is present in the auxiliary memory and that corresponds to the permanent data for recording in said non-volatile memory to be transferred into the read/write memory under the control of said processor, and then to be forwarded to the non-volatile memory from the read/write memory after the processor has deactivated the auxiliary memory by causing the activation signal to be switched back to the non-volatile memory.

The invention also provides an apparatus for programming electrically reprogrammable non-volatile memory associated with a processor which is also associated in conventional manner with a read/write memory, both of said memories being required to enable said processor to operate in a determined manner and both being connected thereto for this purpose via a bus that is normally on a common support, in particular of the circuit card type.

According to another characteristic of the invention, this apparatus includes an "auxiliary" non-volatile memory carried by an independent support suitable for connecting to the support of the processor via connection means so as to connect said auxiliary memory to the bus for communications purposes, and also a switch member under the control of the processor and connected to an output of said processor so as to switch the memory select signal that appears on said output either to the auxiliary memory or else to the non-volatile memory under the control of the processor.

The invention also provides a unit comprising at least one electrically reprogrammable non-volatile memory associated with a processor that is also associated with a read/write memory, both of said memories which are necessary to enable the processor to operate in a determined manner being connected thereto via a bus that is normally on a common support, the unit including connection means suitable for connecting the processor bus to an external source of programming information, in particular of the type comprising an electrically reprogrammable external auxiliary memory, and switch means under the control of the processor and connected to a select output thereof designed for the electrically reprogrammable memory of said processor so as to switch the select signal that appears on said output either to the external source of information, or else to the non-volatile memory under the control of the processor.

BRIEF DESCRIPTION OF THE DRAWING

The invention, its characteristics, and advantages are described in greater detail below with reference to the sole FIGURE of the accompanying drawing.

The sole FIGURE is a block diagram of apparatus of the invention in association with a printed circuit card on which there is mounted, in particular, the non-volatile memory to be programmed.

DETAILED DESCRIPTION OF THE INVENTION

The apparatus of the invention as shown in the figure is designed to enable electrically reprogrammable non-volatile memories to be programmed, and to this end it includes connection means enabling it to make connection with such a memory via communications links serving said memory on the support that carries it.

In the most conventional embodiment, an electrically reprogrammable non-volatile memory such as that referenced 1 is mounted on a printed circuit card 2 that also carriers a processor 3 with which the memory 1 is associated, and a read/write memory 4 that is likewise associated with the processor 3.

In this case, the memory 1 is assumed to be of the type, commonly referred to as the FLASH EPROM type that enables the data required for operation of the processor 3 to be stored in permanent manner during operation in which the processor takes part. It serves in particular to store the operating program, and more particularly a start-up module for the program.

The read/write memory (RAM) 4 is assumed to be capable of storing various kinds of data on a temporary basis for the processor 30, depending on operating requirements, and in a conventional manner.

The memories 1 and 4 and the processor 3 are connected to a data interchange bus 5 whereby they communicate with one another and possibly also with at least one other data emitter and/or receiver element, with said other element(s) being located on the card 2 or elsewhere. When located elsewhere, the card includes means that provide access to the bus 5, conventionally via an appropriate connector which is given the reference 6 in this case. The bus 5 may optionally be accessible from outside the unit including the card 2, particularly when the card forms a part of a device contained in an appliance or in equipment.

Insofar as the initial programming of the memory 1 takes place after the memory has been mounted on the card 2, it is necessary to perform said programming before the card is put into operation, and according to the invention this is done by temporarily connecting the bus 5 to a source of programming information such as an auxiliary memory 7 which contains the data that is to appear in the memory 1. The auxiliary memory 7 is preferably of the non-volatile type and may, for example, be connected in a temporary manner to the bus 5 via the connector 6 in such a manner as to be able to communicate through the connector with the data emitter and/or receiver elements connected to said bus 5, and in particular with the processor 3 and with its read/write memory 4 in the present case.

The processor 3 includes selector outputs enabling it selectively to activate directly or indirectly the various emitter and/or receiver elements that are also connected to the bus 5, one of said outputs being given reference CS0 and being designed to be connected to the memory 1 for the purpose of activating it whenever that is necessary. According to the invention, means are provided for switching said select signal produced by said selector output CS0 either to the memory 1 for which it is normally intended or else to the auxiliary memory 7 should the memory 1 not contain the data that it is desired that it should contain, in particular when it has just been installed and when it contains no data.

To this end, a switch member 8 is provided to put the selector output CS0 of the processor 3 to which it is connected via a wire F0 into communication with a corresponding select input either of the memory 1 via a wire F1, or else with the memory 7 via a wire F7, with this taking place under the control of the processor 3 with which it is also connected via a control input C that passes via the bus 5.

The switch member 8 is suitable for being provided either on the card 2 or else on the support 9 that has the auxiliary memory 7 mounted thereon, and as shown in the FIGURE. The support 9 may be a small card that is connected to the card 2 via the connector 6 which provides either continuity for the wire F7 in the first above-mentioned configuration, or else continuity for the wires F0 and F1 in the second configuration as actually shown in the sole figure.

Permanent data (e.g. data defining an operating program) is loaded into an installed non-volatile memory 1 from an auxiliary memory 7 containing said data, and this is done under the supervision of the processor 3 with which the non-volatile memory 1 is associated.

To this end, the support 9 and the card 2 are interconnected by means of the connector 6 prior to electrical power being applied to the card 2. Insofar as the non-volatile memory 1 is blank or has previously been erased by electrical means, the processor 3 cannot start up in normal manner on the basis of the operating program module that is normally provided for start-up purposes. However, such a module is stored in the auxiliary memory 7 to enable the processor 3 to be put into operation and to enable it to implement a special loading program. The switch member 8 is therefore initially set so as to put the auxiliary memory 7 into communication with the processor 3 and thus to ensure that the non-volatile memory 1 is not in communication therewith.

Once operation has begun, the loading program organizes the transfer of data contained in the auxiliary memory 7 to the read/write memory 4, the transferred data being data for subsequent transfer into the non-volatile memory 1 for permanent storage purposes for the benefit of the processor 3. Thereafter the processor 3 reactivates its non-volatile memory 1 by causing the switch member 8 to operate and can then transfer the data intended for said memory and as temporarily stored in the read/write memory 4, with this being performed, for example, under application of a program module received from the auxiliary memory 7 and then resident in the read/write memory 1.

Reactivation of the non-volatile memory 1 is accompanied by deactivation of the auxiliary memory 7 which can then be separated from the card 2. The same auxiliary memory 7 can naturally be associated in succession with various different cards 2 that are to perform the same functions, thus serving to load the non-volatile memories 1 of said cards, or optionally to reload them, with this being possible both on manufacture and subsequently, e.g., on an operating site.

I claim:

1. A method of programming an electrically reprogrammable non-volatile memory associated with a processor which is also conventionally associated with a read/write memory, both of which memories being necessary to operate the processor in a determined manner, to load the non-volatile memory with operating data necessary for enabling the processor to operate in the determined manner, said method comprising the steps of:

switching a non-volatile memory activation signal to an auxiliary memory that is temporarily connected to a communications bus between the memories and the processor, which activation signal is provided by the processor, thereby enabling said processor to be started up from initiation data contained in the auxiliary memory, while said non-volatile memory remains connected to said communications bus, transferring said operating data from the auxiliary memory into the read/write memory under the control of said processor, switching said activation signal to said non-volatile memory under control of said processor, and forwarding said operating data to the non-volatile memory from the read/write memory.

2. An apparatus for programing an electrically reprogrammable non-volatile memory associated with a processor, which processor provides a memory activation signal at an activation signal output and which processor is also associated in a conventional manner with a read/write memory, both of said memories being required to enable said processor to operate in a determined manner and both being connected thereto for this purpose via a bus that is normally on a common support, the apparatus including an auxiliary non-volatile memory carried by an independent support suitable for connecting to the support of the processor via connection means so as to connect said auxiliary memory to the bus for communications purposes and a switch member under the control of the processor and connected to said activation signal output of said processor so as to switch the memory activation signal either to the auxiliary memory or else to the non-volatile memory under the control of the processor, whereby data can be transferred from said auxiliary memory to said read/write memory when said activation is switched to said auxiliary means and can be transferred from said read/write memory to said non-volatile memory when said activation signal is switched to said non-volatile memory.

3. A programming apparatus according to claim 2, wherein the switch member is mounted on the same independent support as the auxiliary memory and is connectable to the processor and to the non-volatile memory associated with said processor via the connection means.

4. A programming apparatus according to claim 2, wherein the switch member is mounted on the same support as the processor and as the read/write and non-volatile memories that are associated with said processor, which processor is connectable to the auxiliary memory via said connection means.

5. A unit comprising at least one electrically reprogrammable non-volatile memory associated with a processor that is also associated with a read/write memory, both of said memories being necessary to enable the processor to operate in a determined manner and being connected thereto via a processor bus that is normally on a common support, the unit including connection means suitable for connecting the processor bus to an external source of programming information, in particular of the type comprising an electrically reprogrammable external auxiliary memory, and switch means under the control of the processor and connected to an activation output of said processor designed for the electrically reprogrammable memory of said processor, so as to switch an activation signal that appears on said output either to the external source of information, or else to the non-volatile memory under the control of the processors, whereby data can be transferred from said external source of information to said read/write memory when said activation signal is switched to said external source of information and can be transferred from said read/write memory to said non-volatile memory when said activation signal is switched to said non-volatile memory.

6. A programming apparatus according to claim 2, wherein said processor is on said common support with said read/write memory and said non-volatile memory.

* * * * *